US008405538B2

(12) United States Patent
Makihara et al.

(10) Patent No.: US 8,405,538 B2
(45) Date of Patent: Mar. 26, 2013

(54) CYCLIC A/D CONVERTER

(75) Inventors: Tetsuya Makihara, Nukata-gun (JP); Masakiyo Horie, Gamagori (JP); Kazutaka Honda, Chiryu (JP)

(73) Assignee: DENSO CORPORATION, Kariya (JP)

( * ) Notice: Subject to any disclaimer, the term of this patent is extended or adjusted under 35 U.S.C. 154(b) by 126 days.

(21) Appl. No.: 13/050,074

(22) Filed: Mar. 17, 2011

(65) Prior Publication Data
US 2011/0234441 A1 Sep. 29, 2011

(30) Foreign Application Priority Data

Mar. 24, 2010 (JP) .................................. 2010-67902

(51) Int. Cl.
*H03M 1/34* (2006.01)
(52) U.S. Cl. ......... 341/163; 341/122; 341/155; 341/172
(58) Field of Classification Search .................. 341/155, 341/172, 161, 120, 163, 122, 156
See application file for complete search history.

(56) References Cited

U.S. PATENT DOCUMENTS

| | | | | |
|---|---|---|---|---|
| 5,416,485 A | * | 5/1995 | Lee | 341/172 |
| 6,836,236 B2 | * | 12/2004 | Horie | 341/155 |
| 6,927,723 B2 | * | 8/2005 | Nomasaki et al. | 341/172 |
| 7,173,556 B2 | * | 2/2007 | Kobayashi et al. | 341/161 |
| 7,405,681 B2 | * | 7/2008 | Jonsson et al. | 341/120 |
| 2005/0024250 A1 | | 2/2005 | Atriss et al. | |
| 2007/0080842 A1 | | 4/2007 | Kawahito | |
| 2008/0074304 A1 | * | 3/2008 | Horie | 341/155 |

FOREIGN PATENT DOCUMENTS

| | | |
|---|---|---|
| JP | 2008-216135 A | 9/2008 |
| JP | 2009-33634 A | 2/2009 |

* cited by examiner

Primary Examiner — Jean B Jeanglaude
(74) Attorney, Agent, or Firm — Posz Law Group, PLC

(57) ABSTRACT

A control circuit connects a capacitor to an input terminal and an output terminal of an operational amplifier and applies a signal charge to charge the capacitor with a switch being turned off. Thus, a conversion voltage corresponding to the signal charge is outputted from the operational amplifier. The control circuit then sets charges, which correspond to the conversion voltage, in capacitors and reallocates the charges among the capacitors by connecting non-common electrodes of the capacitors to either one of a plurality of reference voltage lines in accordance with a conversion result of an A/D conversion circuit with the capacitor being connected to the input terminal and the output terminal of the operational amplifier. The control circuit thereafter performs, a number of times, charge setting, initialization and subsequent charge reallocation in accordance with a residual voltage outputted from the operational amplifier.

6 Claims, 11 Drawing Sheets

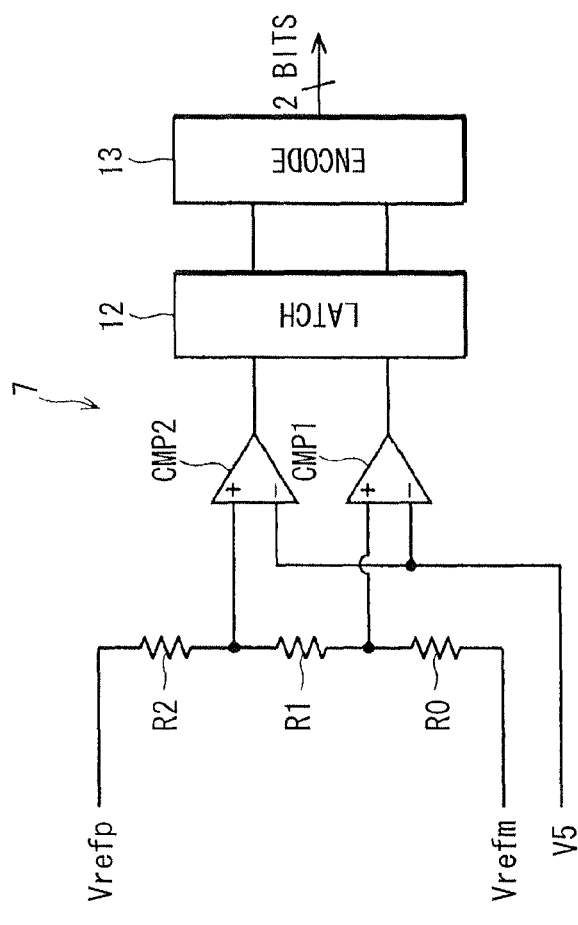
FIG. 2
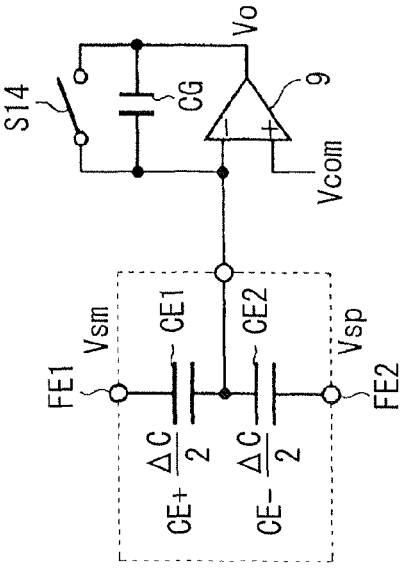
FIG. 4A  RESET
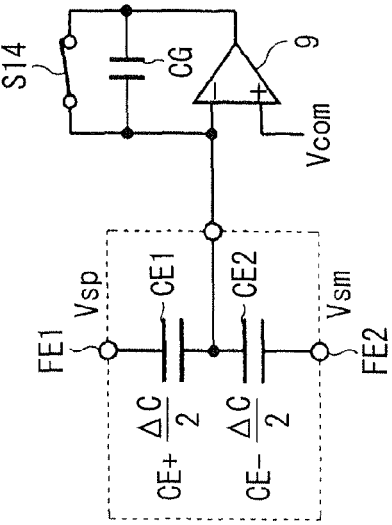
FIG. 4B  C/V CONVERSION

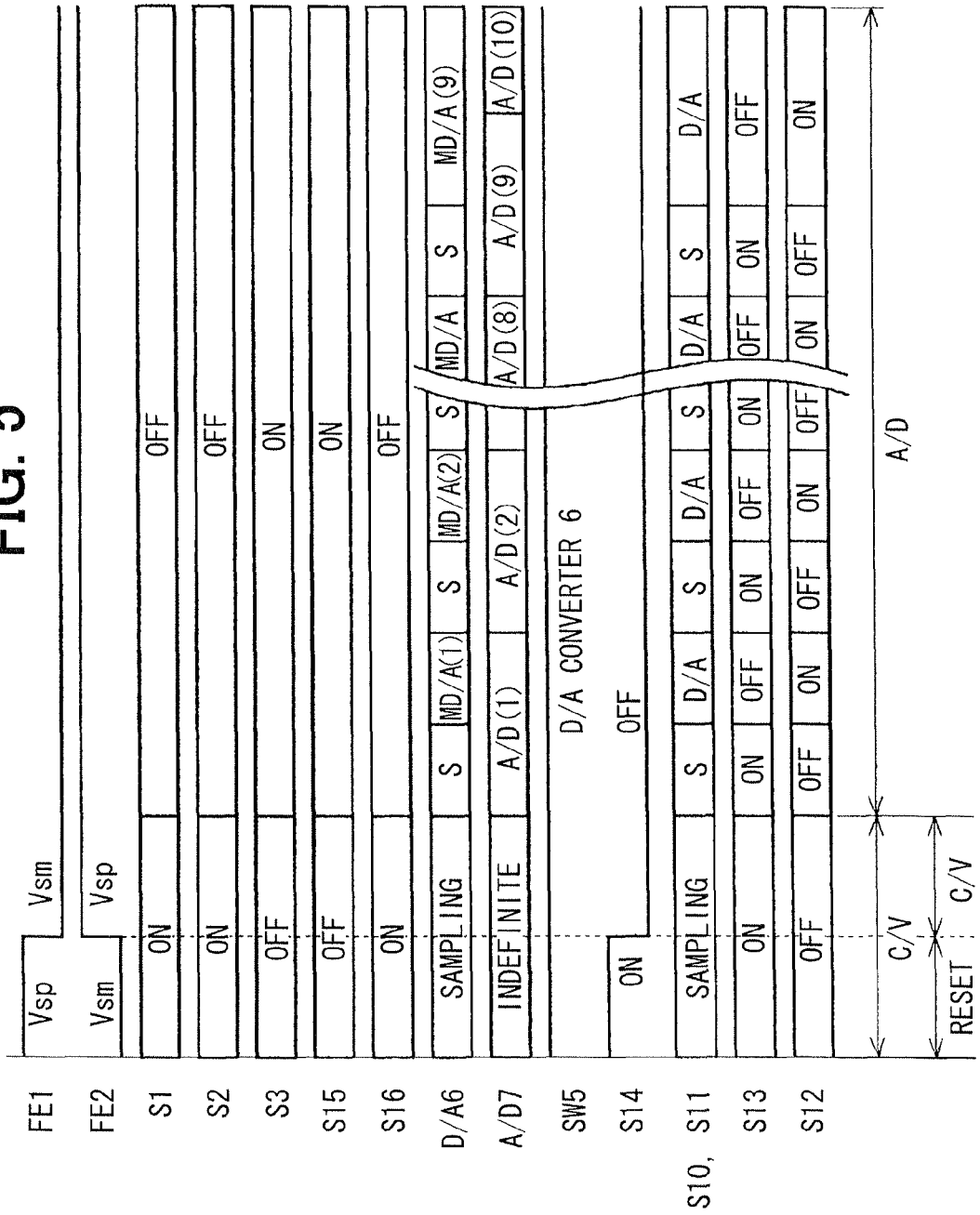

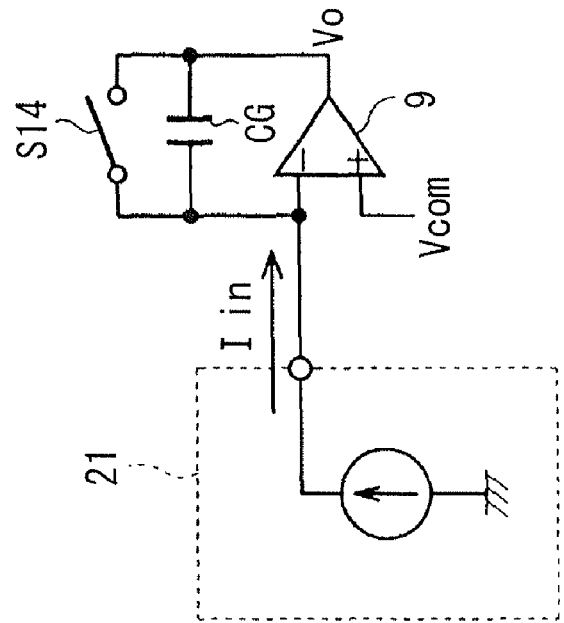
FIG. 7B I/V CONVERSION
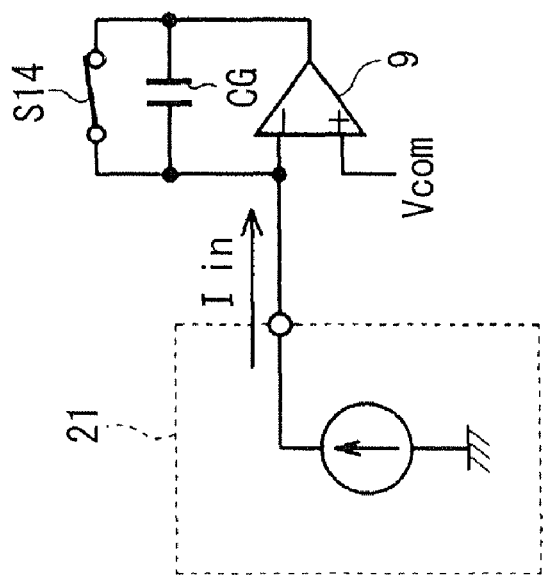
FIG. 7A RESET

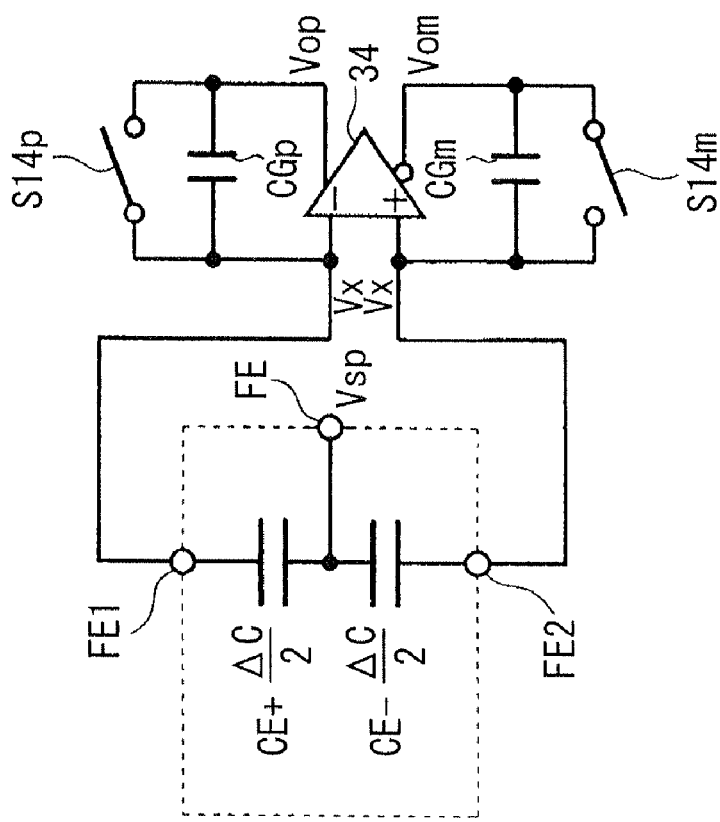
FIG. 10A RESET
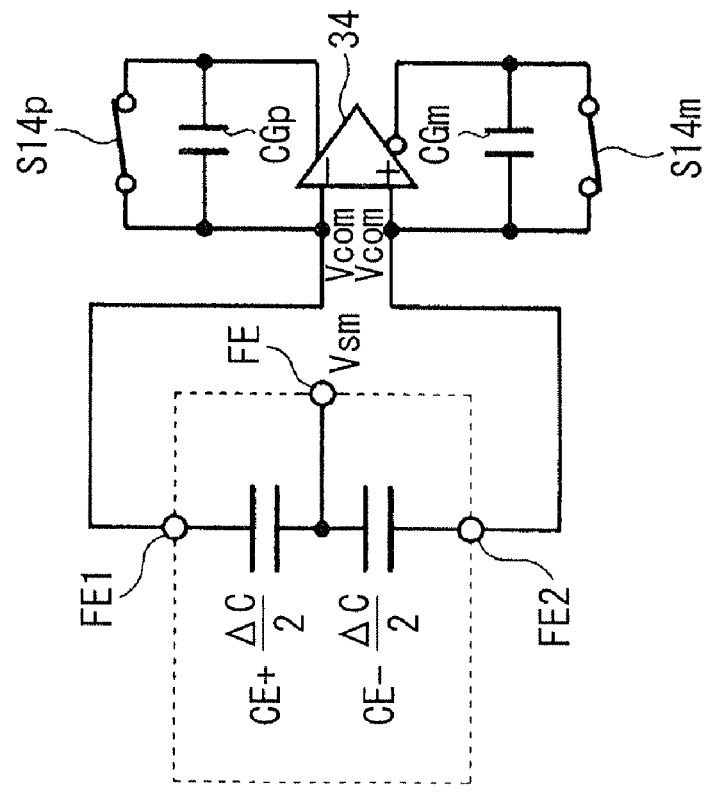
FIG. 10B C/V CONVERSION

US 8,405,538 B2

CYCLIC A/D CONVERTER

CROSS REFERENCE TO RELATED APPLICATION

This application is based on and incorporates herein by reference Japanese patent application No. 2010-67902 filed on Mar. 24, 2010.

FIELD OF THE INVENTION

The present invention relates to a cyclic A/D converter.

BACKGROUND OF THE INVENTION

A vehicular sensor such as an acceleration sensor, a pressure sensor and an exhaust gas sensor outputs an electric signal, which varies with a physical quantity of a detection object. Such a sensor may be a voltage output type, a capacitance detection type, a current output type or the like. An A/D converter mounted in a vehicular microcomputer converts an input analog voltage into a digital data.

In case that the sensor produces an output signal, which is not an analog voltage, signal processing circuits are provided at a pre-stage of the A/D converter for signal processing (for example, patent document 1). The signal processing circuits are, for example, a special circuit having a C/V conversion function or an I/V conversion function and an amplifier circuit for amplifying an output signal of the special circuit. Alternatively, an A/D converter having an amplification function is employed (for example, patent document 2).
Patent document 1: JP 2008-216135A
Patent document 2: JP 2008-104142A (US 2008/0074304 A1)

In case that a C/V converter, an amplifier and the like are provided in addition to an A/D converter as disclosed in patent document 1, circuit area and power consumption increase correspondingly. In case that an A/D converter having an amplification function is provided as disclosed in patent document 2, no amplifier need be provided separately. However, a C/V converter need be provided. Circuit area and power consumption increase correspondingly.

SUMMARY OF THE INVENTION

It is an object of the present invention to provide a cyclic A/D converter, which performs A/D conversion by converting an input signal to an analog voltage in case that the input signal is other than voltage.

According to one aspect of the present invention, a cyclic A/D converter includes an A/D conversion circuit, a residual voltage generation circuit, an input circuit and a control circuit. The residual voltage generation circuit is configured to generate a residual voltage by amplifying a differential voltage between an input voltage, which is applied to the A/D conversion circuit, and a predetermined analog voltage. The input circuit is configured to select a residual voltage outputted from the residual voltage generation circuit or an input voltage inputted from an external side and apply a selected voltage to both the A/D conversion circuit and the residual voltage generation circuit. The control circuit is configured to control the input circuit and the residual voltage generation circuit so that the A/D conversion circuit performs an A/D conversion of the residual voltage outputted, by the residual voltage generation circuit while using, as the predetermined analog voltage of the residual voltage generation circuit, a D/A conversion value of a digital conversion value outputted from the A/D conversion circuit to circulate the residual voltage through the input circuit, the A/D conversion circuit and the residual voltage generation circuit.

The cyclic A/D converter further includes an input switching circuit, which is configured to switchably input an external signal charge to the residual voltage generation circuit. The control circuit is further configured to control the input switching circuit to input the external signal charge to the residual voltage generation circuit, control the residual voltage generation circuit to perform a voltage conversion operation for outputting a converted voltage corresponding to the external signal charge and control the input circuit to select the converted voltage for application to the A/D conversion circuit and the residual voltage generation circuit, before the A/D conversion circuit starts the A/D conversion operation of the converted voltage outputted from the residual voltage generation circuit.

BRIEF DESCRIPTION OF THE DRAWINGS

The above and other objects, features and advantages of the present invention will become more apparent from the following detailed description made with reference to the accompanying drawings. In the drawings:

FIG. 2 is a circuit diagram of a 1.5-bit A/D conversion circuit in the cyclic A/D converter shown in FIG. 1;

FIGS. 4A and 4B are circuit diagrams of a part of the cyclic A/D converter related to C/V conversion operation;

FIG. 5 is an operation diagram of a cyclic A/D converter according to a second embodiment;

FIGS. 7A and 7B are circuit diagrams of a part of the cyclic A/D converter related to C/V conversion operation;

FIGS. 10A and 10B are circuit diagrams of a part of the cyclic A/D converter related to C/V conversion operation;

DETAILED DESCRIPTION OF THE PREFERRED EMBODIMENT

First Embodiment

A cyclic A/D converter according to a first embodiment is described below with reference to FIGS. 1 to 4.

Figure 1:
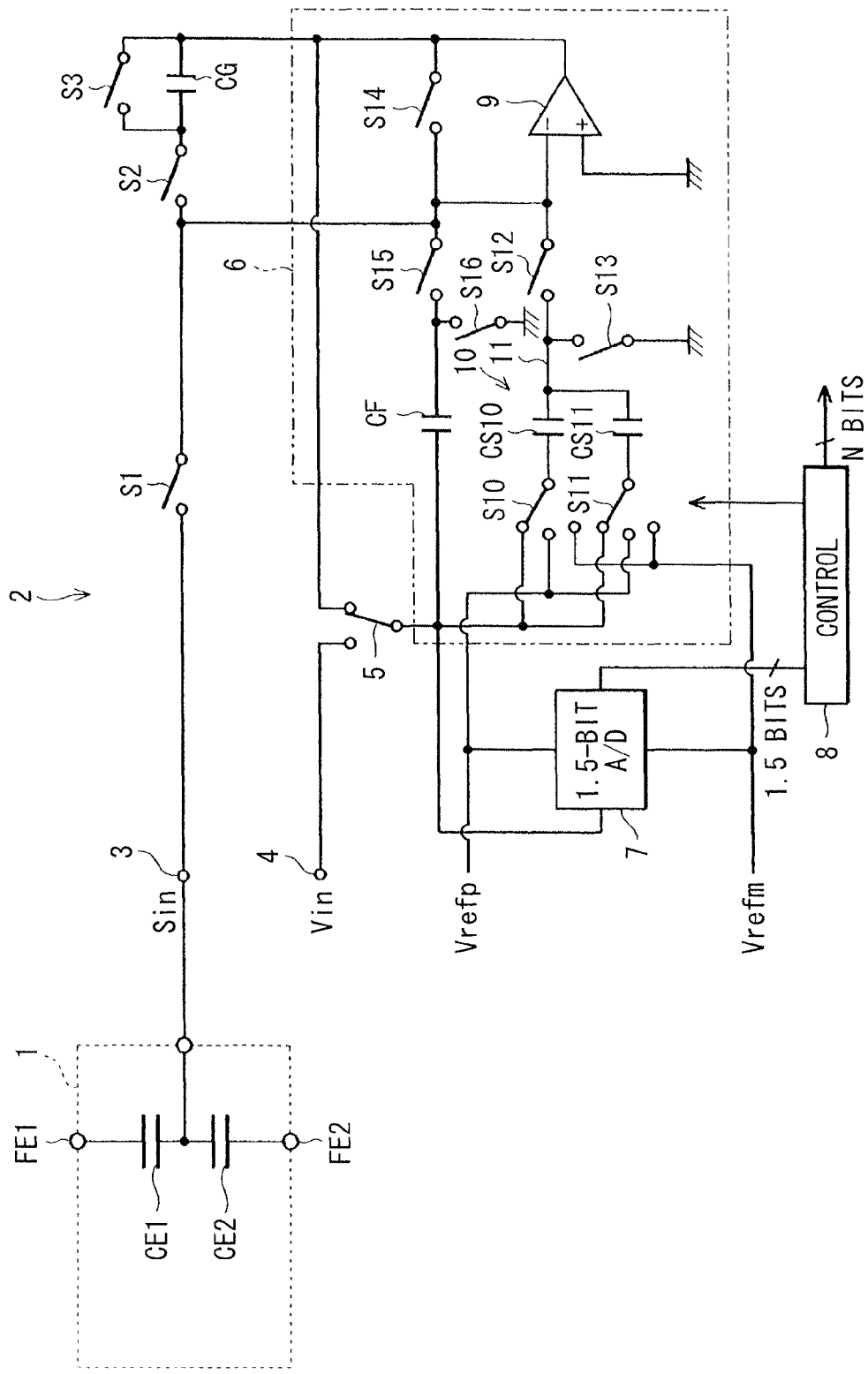
FIG. 1 is a circuit diagram of a cyclic A/D converter according to a first embodiment of the present invention.

FIG. 1 shows a capacitive acceleration sensor, which has a sensor element 1 and used in an in-vehicle control integrated circuit (IC), and a cyclic A/D converter 2 configured to A/D-convert an output signal of the capacitive acceleration sensor. The sensor element 1 of the capacitive acceleration sensor has capacitors CE1 and CE2. Capacitances of the capacitors CE1 and CE2 are CE in case no acceleration is applied. The capacitors CE1 and CE2 change respective capacitances complementarily in accordance with acceleration applied thereto. For example, when the capacitance of the capacitor CE1 increases by $\Delta C/2$, the capacitance of the capacitor CE2 decreases by ΔC/2. The capacitors CE1 and CE2 are connected to terminals FE1 and FE2, respectively. Drive voltages Vsp and Vsm are applied alternately to the terminals FE1 and FE2. The capacitors CE1 and CE2 are connected to each other and to a signal input terminal 3 of the cyclic A/D converter 2.

The cyclic A/D converter 2 is configured to have a function of a C/V converter, which converts (detects) a change in the capacitance (C) of the capacitors CE1 and CE2 into an analog voltage (V). The cyclic A/D converter 2 C/V-converts a signal charge Sin (external signal charge C) applied to the signal input terminal 3 and amplifies a converted voltage. The cyclic A/D converter 2 then A/D-converts the amplified voltage and outputs a N-bit A/D conversion code (digital data of N bits). The cyclic A/D converter 2 further amplifies a signal voltage Vin inputted to a signal input terminal 4, A/D-converts the amplified voltage and outputs a N-bit A/D conversion code. The cyclic A/D converter 2 is configured to selectively perform either one of the foregoing operations in accordance with types of input signals (sensor output forms). The cyclic A/D converter 2 is thus capable of A/D converting its input signal, whether the input signal is a voltage or a charge.

The cyclic A/D converter 2 is configured with a switching circuit 5, a multiplying D/A converter 6, an A/D conversion circuit 7, a control circuit 8, a capacitor CG and switches S1 to S3. The switching circuit 5 operating as an input circuit selects either one of the signal voltage Vin inputted to the signal input terminal 4 or an output voltage of the multiplying D/A converter 6 and inputs the selected voltage to both the A/D conversion circuit 7 and the multiplying D/A converter 6. In case that the input signal is a charge other than a voltage, the switching circuit 5 is fixed to a state shown in FIG. 1 to select the output voltage of the multiplying D/A converter 6.

The multiplying D/A converter 6, which operates as a residual voltage generation circuit, amplifies a differential voltage between the input voltage of the A/D conversion circuit 7 and an analog voltage, which is produced by D/A conversion of a digital value outputted from the control circuit 8, and generates an amplified voltage or a residual voltage. The multiplying D/A converter 6 outputs this voltage after sample-holding it.

The multiplying D/A converter 6 is configured with an operational amplifier 9, a capacitor array circuit 10, a capacitor CF and switches S10 to S16. The capacitor array circuit 10 includes array capacitors CS10 and CS11, both of which have the same capacitance CS. Low-side electrodes (common electrodes) of the capacitors CS10 and CS11 are connected to a common line 11. High-side (non-common electrodes) are connectable to either one of a reference voltage line Vrefp (5V), a reference voltage line Vrefm (0V) and a common terminal of the switching circuit 5 through respective switches S10 and S11.

The common line 11 is connected to an inverting input terminal (−) of the operational amplifier 9 through the switch 12 operating as a switching circuit and to a ground (fixed voltage line) through the switch. S13. The switch S14 is connected between the inverting input terminal and an output terminal of the operational amplifier 9. The capacitor CF and the switch S15 are connected in series between the common terminal of the switching circuit 5 and the inverting input terminal of the operational amplifier 9. The common connection terminal of the capacitor CF and the switch S15 is connected to the ground through the switch S16. A non-inverting input terminal (+) of the operational amplifier 9 is connected to the ground. The capacitor CF has a capacitance (2×CS), which is twice as large as that of the capacitors CS10 and CS11. The capacitor CF, which operates as a second integrating capacitor, is connectable to inbetween the input terminal and the output terminal of the operational amplifier 9 under a condition that the switch S14 is turned off, the switch S15 is turned on and the switching circuit 5 is switched to the multiplying D/A converter 6.

The switch S1, which operates as an input switching circuit, is connected between the signal input terminal 3 and the inverting input terminal of the operational amplifier 9. The switch S2 and the capacitor CG, which operates as a first integrating capacitor) are connected in series between the inverting input terminal and the output terminal of the operational amplifier 9. The switch 3 is connected between the terminals of the capacitor CG. The capacitance of the capacitor CG may be set in correspondence to a desired gain of the C/V conversion.

The A/D conversion circuit 7 is configured as shown in FIG. 2. The A/D conversion circuit 7 receives predetermined reference voltages Vrefp (5V) and Vrefm (0V) and outputs digital conversion values of M (1.5) bits, which are three values of 0 (00), 1 (01) and 2 (10). Specifically, the differential voltage indicating a difference between the reference voltages Vrefp and Vrefm is divided by resistors R0, R1 and R2. A junction between the resistors R0 and R1 is connected to a non-inverting input terminal of a comparator CMP1. A junction between the resistors R1 and R2 is connected to a non-inverting input terminal of a comparator CMP2. A voltage V5, which is either the input voltage Vin of the input terminal 4 or the output voltage of the multiplying D/A converter 6, is applied to the inverting input terminals of the comparators CMP1 and CMP2. Resistances of the resistors R0, R1 and R2 are set to satisfy a relation that the resistances of the resistors R0 and R2 are 1.5 R(Ω) relative to a resistance R(Ω) of the resistor R1.

Output signals, which are outputted as either a high level signal or a low level signal, are inputted to a latch circuit 12. The latch circuit 12 latches the output signals produced from the comparators CMP1 and CMP2 and outputs a latched output signal to an encoder 13, when a latch signal level becomes high. The encoder 13 generates and outputs an A/D conversion code of three values based on the output signal from the latch circuit 12.

Figure 3:
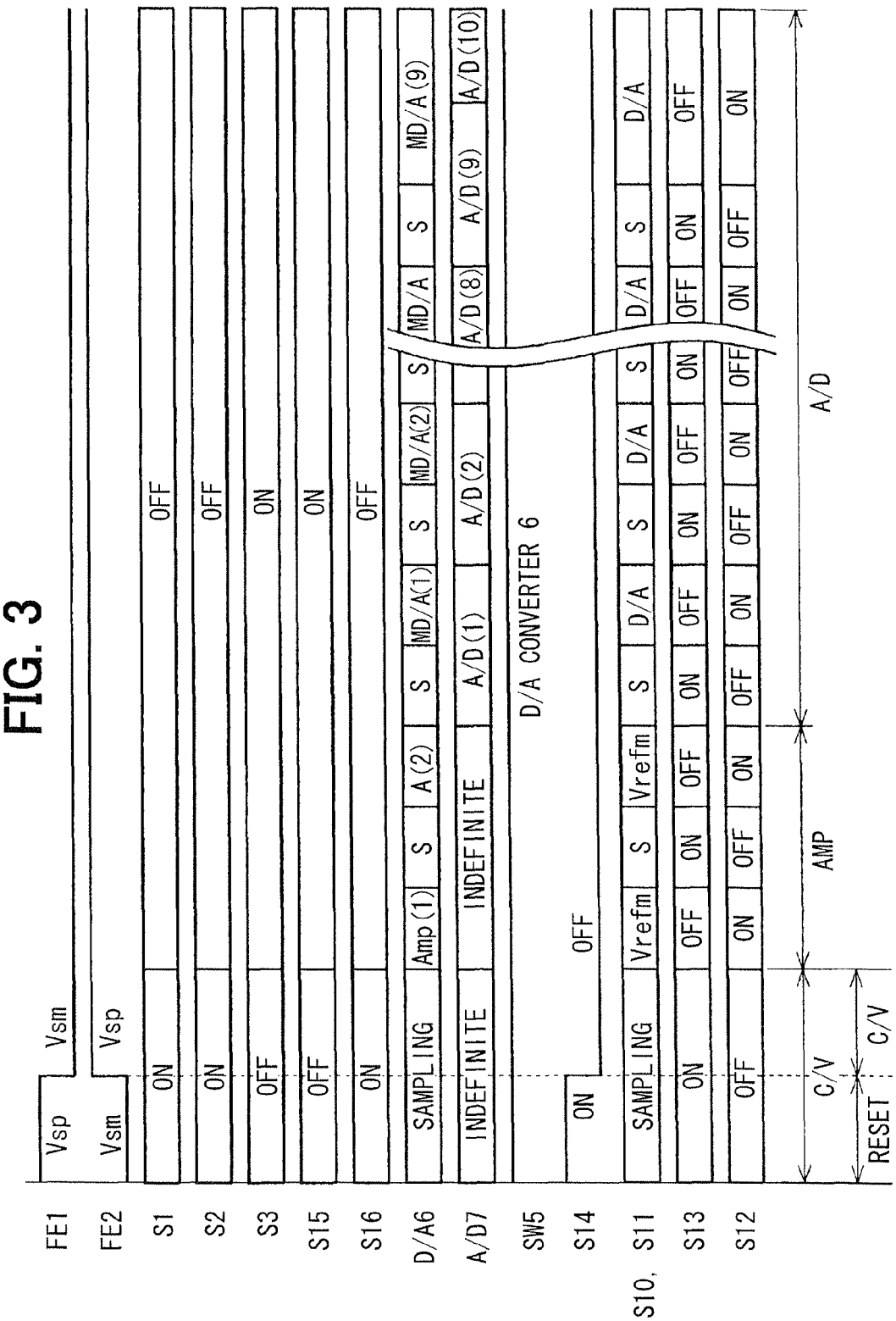
FIG. 3 is an operation diagram of the cyclic A/D, converter according to the first embodiment.

The operation of the cyclic A/D converter 2 is described next with reference to operation timings shown in FIG. 3, in which functions of the multiplying D/A converter 6 are indicated by bracketed numbers. The cyclic A/D converter 2 amplifies the signal charge Sin after performing C/V conversion by using the switching circuit 5, the multiplying D/A converter 6 and the like which are normally provided to perform the A/D conversion. The control circuit 8 controls the A/D conversion circuit 7 and the switches S1 to S3 and the switches S10 to S16 so that the following operations are performed. First, as shown in FIG. 3, the signal charge Sin is C/V-converted. The converted voltage resulting from the C/V conversion is circulated once (passed through the multiplying D/A converter 6 twice) to be amplified. The amplified voltage is thereafter circulated nine times (ten times of A/D conversions by the A/D conversion circuit 7) to perform the A/D conversion operation of 10 bits.

(1) C/V Conversion Operation

The control circuit 8 performs the C/V conversion operation (voltage conversion operation) prior to the amplification operation and the A/D conversion operation. That is, the switching circuit 5 is switched to the multiplying D/A converter 6 side and the switches S10 and S11 are switched to the switching circuit 5 side as shown in FIG. 1. Further, the switches S1, S2, S13, S14, S16 are turned on and the switches S3, S12, S15 are turned off. Thus, charges of the capacitors are initialized [Sampling abbreviated as S]. This charge initialization operation corresponds to resetting of the C/V conversion operation. FIG. 4A schematically shows a part of the cyclic A/D converter 2, which relates to the C/V conversion operation in a period of being reset (reset period). As shown in FIGS. 3 and 4A, voltages Vsp and Vsm are applied to the terminals FE1 and FE2 of the sensor element 1 during the reset period, respectively. The inverting input terminal and the output terminal of the operational amplifier 9 are shorted by the switch S14. Thus, a charge Qr at the inverting input terminal of the operational amplifier 9 in the reset period is expressed by the following equation (1), in which the ground potential (0V) is assumed to be Vcom.

$$Qr=(CE+\Delta C/2)(Vsp-Vcom)+(CE-\Delta C/2)(Vsm-Vcom) \quad (1)$$

Then, the switch S14 is turned off to charge the capacitor CF with the signal charge Sin. This charge setting operation corresponds to conversion in the C/V conversion operation. FIG. 4B schematically shows a part of the cyclic A/D converter 2, which relates to the C/V conversion operation in a period of the conversion operation (conversion period). As shown in FIGS. 3 and 4B, the voltages Vsm and Vsp are applied to the terminals FE1 and FE2 of the sensor element 1 during the conversion period, respectively. The capacitor CG is connected between the inverting input terminal and the output terminal of the operational amplifier 9. Thus, a charge Qc at the inverting input terminal of the operational amplifier 9 in the conversion period is expressed by the following equation (2), in which the output voltage of the operational amplifier 9 after the C/V conversion is assumed to be Vo.

$$Qc=(CE+\Delta C/2)(Vsm-Vcom)+(CE-\Delta C/2)(Vsp-Vcom)+CG(Vo-Vcom) \quad (2)$$

The charges Qr and Qc in the foregoing periods are equal as expressed by the following equation (3) according to the law of conservation of charge.

$$Qr=Qc \quad (3)$$

From the equations (1) to (3), the output voltage Vo after the C/V conversion is expressed by the following equation (4).

$$Vo=(\Delta C/CG)(Vsp-Vsm)+Vcom \quad (4)$$

The output voltage Vo thus corresponds to a sum of an offset voltage Vcom and a voltage, which is an amplification of a change ΔC in capacitances of the capacitors CE1 and CE2 by a gain (1/CG)(Vsp−Vsm). At this time the capacitors CF, CS10 and CS11 are charged by the output voltage Vo (sampling).

(2) Amplification Operation

The control circuit 8 performs an amplification operation following the C/V conversion operation. That is, after turning off the switches S1, S2, S13 and S16, the switches S10, S11 are switched to the Vrefm side and the switches S3, S12, S15 are turned on. Thus, the multiplying D/A converter 6 performs an amplification operation [Amplification (1) abbreviated as Amp(1) or A(1)].

The capacitor CF is connected between the input terminal and the output terminal of the operational amplifier 9 so that the charge is reallocated among the capacitors CF, CS10 and CS11. The charge reallocation is expressed by the following equation (5), in which the output voltage of the operational amplifier 9 is assumed to be Vo and Vrefm is assumed to be 0V. The amplified output voltage Vo is expressed by the following equation (6). Thus, by passing the voltage after the C/V conversion through the multiplying D/A converter 6 once, the gain is doubled.

$$(CF+2\cdot CS)(Vin-0)=2\cdot CS(0-0)+CF(Vo-0) \quad (5)$$

$$Vo=(CF+2\cdot CS)/CF\cdot Vin=2\cdot Vin \quad (6)$$

According to the first embodiment, for providing a higher gain, the control circuit 8 turns off the switch S12 so that the amplified voltage is held, the held voltage is circulated to the multiplying D/A converter 6 through the switching circuit 5 and the circulated voltage is amplified again (second time) by the multiplying D/A converter 6. That is, the switches S10, S11 are switched to the switching circuit 5 side and the switch S13 is turned on. Thus the capacitors CS10 and CS11 are charged with respective charges [Sampling]. Then, after turning off the switch S13, the switches S10 S11 are switched to Vrefm side and the switch S12 is turned on. Thus the charge is reallocated [Amp(2)]. The amplification operation is terminated when the amplified voltage is held by turning off the switch S12.

(3) A/D Conversion Operation

The control circuit 8 outputs a latch signal of high level to the latch circuit 12 of the A/D conversion circuit 7. The switches S10, S11 are switched to the switching circuit 5 side and the switch S13 is turned on. Thus the capacitors CS10 and CS11 are charged by the amplified voltage and set with respective charges [Sampling]. After the charge setting is completed, the switch S13 is turned off and the switch S12 is turned on. Further, the switches S10 and S11 are switched to the Vrefp side or the Vrefm side in accordance with the A/D conversion value of the A/D conversion circuit 7. Thus, the charge reallocation is performed (MD/A(1)].

It is noted here that the control circuit 8 receives the digital conversion value outputted from the A/D conversion circuit 7 and outputs control signals for the switches S10 and S11. The predetermined voltage Vrefp or Vrefm is applied to the capacitors CS10 and CS11. In accordance with the ratio between the capacitances of the capacitors CS10 and CS11 and the voltage applied to the capacitors CS10 and CS11, the predetermined analog voltage applied to the residual voltage generation circuit 6 is determined. Thus, the predetermined analog voltage is variable with the digital conversion value outputted from the A/D conversion circuit 7.

The control circuit 8 turns off the switch S12 and holds the residual voltage after completion of the charge reallocation. The residual voltage is circulated to the multiplying D/A converter 6. The A/D conversion circuit 7 performs K (ten) times of A/D conversions by passing the amplified voltage (residual voltage) to the multiplying D/A converter 6 K−1 (nine) times. A shift addition circuit (not shown) of the control circuit 8 finally outputs N (ten) bits of A/D conversion code by sequentially adding the A/D conversion values while overlapping each A/D conversion value bit by bit. In case of N=3 bits, as a simplified example, the first, second and third A/D conversion values are overlapped bit by bit three times and added. Then the lowest significant bit LSB "1" is canceled so that 3-bit A/D conversion code is provided.

| | |
|---|---|
| First A/D conversion value | 01 |
| Second A/D conversion value | 10 |
| Third A/D conversion value | 01 |
| Addition of the three values | 1001 |
| Three-bit code after canceling LSB | 100 |

The cyclic A/D converter 2 operates as described above, when the signal charge Sin of the sensor element 1 of the capacitive acceleration sensor is inputted to the terminal 3. The cyclic A/D converter 2 operates differently, however; when the signal voltage Vin of a sensor, which outputs an analog voltage as its output signal, is applied. That is, the cyclic A/D converter 2 amplifies the signal voltage Vin by using the switching circuit 5, the multiplying D/A converter 6 and the like, which are originally provided for performing the A/D conversion and then performs the A/D conversion by using the A/D conversion circuit 7 as well. The control circuit 8 controls the A/D conversion circuit 7, the switches S1 to S3 and the switches S10 to S16 thereby to perform the amplification operation and the A/D conversion operation. Specifically, the signal voltage Vin is circulated once (the signal voltage Vin is passed through the multiplying D/A converter 6 two times) for the amplification operation. Then, the amplified voltage is circulated nine times (ten times of A/D conversions by the A/D conversion circuit 7) for the A/D conversion operation of 10 bits.

The control circuit 8 performs the amplification operation as follows prior to the A/D conversion operation. The switching circuit 5 is switched to the signal input terminal 4 side (signal voltage Vin side) and the switches S10, S11 are switched to the switching circuit 5 side. Further, the switches S3, S13, S14, S15 are tuned on and the switches S1, S2, S12, S16 are tuned off. Thus, the capacitors CF, CS10 and CS11 are charged with the signal voltage Vin [Sampling]. The switches S13 and S14 are turned off, the switching circuit 5 is switched to the multiplying D/A converter 6 side, the switches S10, S11 are switched to Vrefm side and the switch S12 is turned on. Thus, the multiplying D/A converter 6 performs the amplification operation [Amp(1)]. The amplified output voltage Vo is expressed by the foregoing equation (6). Thereafter, in the similar manner as in the case the signal charge Sin is inputted the multiplying D/A converter 6 performs the second amplification operation [Amp(2)]. The subsequent A/D conversion operation is performed in the similar manner as in the case the signal charge Sin is inputted.

As described above, the cyclic A/D converter 2 according to the first embodiment first performs the C/V conversion of the signal charge Sin by using the switching circuit 5, the multiplying D/A converter 6 and the like, which are normally provided for A/D conversion by an A/D converter, prior to the amplification operation and the A/D conversion operation, when the signal charge Sin is inputted as the input signal. Thus, the signal charge Sin outputted from the sensor element 1 of the capacitive acceleration sensor, that is, the difference in charges of the capacitors CE1 and CE2 of the sensor element 1, is converted into the voltage. The cyclic A/D converter 2 amplifies the QV-converted voltage with a gain of a predetermined number of folds by circulating the C/V-converted voltage through the switching circuit 5 and the multiplying D/A converter 6 a predetermined number of times. Thus, the A/D conversion is performed after amplifying a small level of voltage proportional to the change ΔC in the capacitance of the capacitive acceleration sensor and adjusting it to a dynamic range (for example between 0V and 5V), which is suitable for the A/D conversion. As a result, the resolving power of the A/D converter (having no amplification function) is used effectively so that the resolution in the A/D conversion is effectively increased.

The cyclic A/D converter 2 performs the amplification operation by using its circuit parts, which are originally provided in the A/D converter 2 for performing the A/D conversion. The cyclic A/D converter 2 further performs the C/V conversion operation by simply adding the capacitor CG and the switches S1 to S3, S15, S16 to the circuit parts, which are originally provided in the cyclic A/D converter 2 for performing the A/D conversion. That is, the cyclic A/D converter 2 is configured to perform the C/V conversion operation, the amplification operation and the A/D conversion operation by using the operational amplifier 9 in common. Therefore, as opposed to the conventional A/D converter, it is not necessary to add a C/V converter and an amplifier at a pre-stage of the cyclic A/D converter 2. Thus the circuit configuration is simplified and a chip size of the integrated circuit is reduced. The multiplying D/A converter 6 generally has high degree of accuracy to provide a high A/D conversion accuracy. By using such a multiplying D/A converter, not only a C/V converter having high accuracy and low offset characteristics is realized but also an amplifier having high accuracy, low offset and high linearity characteristics is realized. Since the gain is varied in accordance with the number of times of passing through the multiplying D/A converter 6 (number of times of circulation plus 1), a programmable variable gain amplifier is realized.

Since the switch 12 is provided between the common line 11 and the inverting input terminal of the operational amplifier 9, the switch S12, the operational amplifier 9 and the capacitor CF for integration operate as a sample-hold circuit separated from the capacitor array circuit 10. As a result, no sample-hold circuit need be provided separately and hence circuit configuration is more simplified. Since the switch S13 is provided, the sampled and held voltage is charged to the array capacitors CS10 and CS11. Thus, the cyclic operation is performed.

In addition, the cyclic A/D converter 2 amplifies the signal voltage Vin inputted to the signal input terminal 4 and A/D-converts the amplified voltage to output the N-bit A/D conversion code. As a result, the cyclic A/D converter 2 performs the A/D conversion on its input signal whether the input signal is a charge or a voltage. That is, the cyclic A/D converter 2 A/D-converts not only a signal outputted from a capacitive sensor but also a signal outputted from a voltage output type sensor such as a pressure sensor.

The capacitor CG is used as the first integrating capacitor in the C/V conversion operation time and the capacitor CF is used as the second integrating capacitor in both the amplification operation time and the A/D conversion operation time. The capacitances of the capacitors CG and CF may be determined individually. As a result, it is possible to set the gain in the C/V conversion operation and the gain in the amplification operation and the A/D conversion operation individually. Thus it is possible to set each of the gains without influencing on the other gain.

Second Embodiment

A cyclic A/D converter according to a second embodiment is described next with reference to FIG. 5, in which the same or similar parts as the first embodiment are designated with the same or similar reference numerals.

In the first embodiment, the cyclic A/D converter 2 performs the A/D conversion after C/V-converting the signal charge Sin and then amplifying the C/V converted voltage. It is possible to obviate the amplification operation in the first embodiment, in case that the voltage outputted as a result of C/V conversion of the signal charge Sin is already suitable for the dynamic range of the A/D conversion. According to the second embodiment, the cyclic A/D converter 2 is configured to perform the A/D conversion of the voltage outputted by the C/V conversion of the signal charge Sin.

(1) C/V Conversion Operation

As shown in FIG. 5, the control circuit 8 performs the C/V conversion operation (Sampling) in the similar manner as in the first embodiment prior to the A/D conversion operation.

(2) A/D Conversion Operation

The control circuit 8 performs the A/D conversion operation immediately following the C/V conversion operation. That is, the high level latch signal is outputted to the latch circuit 12 of the A/D conversion circuit 7. The switches S1, S2, S16 are turned off and the switches S3, S15 are turned on. Thus, the capacitors CS11 and CS12 are charged with the output voltage Vo outputted by the C/V conversion. After the charging, the switch S13 is turned off and then the switch S12 is turned on. In addition, the switches S10 and S11 are switched to either the Vrefp side or the Vrefm side in accordance with the A/D conversion value of the A/D conversion circuit 7 thereby to perform reallocation of charge [MD/A (1)].

After the charge reallocation is completed, the switch S12 is turned off. The residual voltage is thus held and circulated to the multiplying D/A converter 6. By passing the residual voltage to the multiplying D/A converter 6 K−1 (nine) times, the A/D conversion circuit 7 performs the A/D conversion K (ten) times. ?? The shift addition circuit (not shown) of the control circuit 8 finally outputs N (ten) bits of A/D conversion code by sequentially adding the A/D conversion values while overlapping each A/D conversion value bit by bit.

The cyclic A/D converter 2 according to the second embodiment performs the A/D conversion, without amplification operation, after performing the C/V conversion operation when the signal charge Sin is inputted as the input signal. As a result, if the voltage outputted by the C/V conversion of the signal charge Sin already has a dynamic range suitable for the A/D conversion, the amplification operation, which is not necessary, is not performed. Thus time required for the A/D conversion operation is shortened and A/D conversion, efficiency is increased.

Third Embodiment

A cyclic A/D converter according to a third embodiment is described next with reference to FIGS. 6 and 7, in which the same or similar parts as the first embodiment are designated with the same or similar reference numerals.

Figure 6:
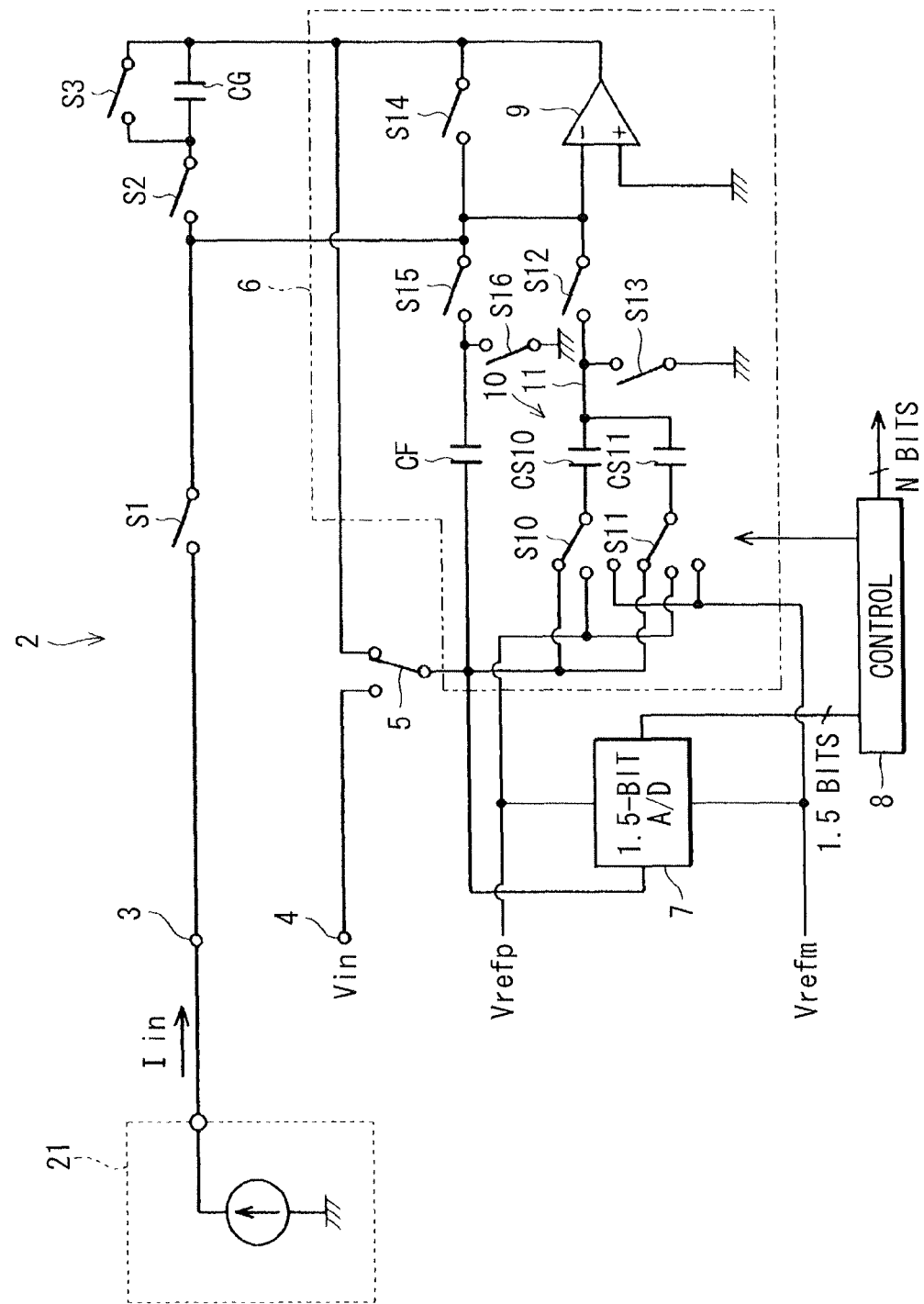
FIG. 6 is a circuit diagram of a cyclic A/D converter according to a third embodiment of the present invention.

According to the third embodiment, as shown in FIG. 6, a detection current Iin is inputted from an exhaust gas sensor 21 to the cyclic A/D converter 2 through the signal input terminal 3. The exhaust gas sensor 21 is configured to output the detection current Iin, which varies with NOx concentration contained in exhaust gas of an engine of a vehicle, for example. Current indicates an amount of charge flowing per unit time. The detection current Iin thus corresponds to external signal charge.

The cyclic A/D converter 2 I/V-converts the detection current Iin by using the switching circuit 5, the multiplying D/A converter 6 and the like, which are originally and normally provided for A/D conversion, and then amplifies the converted voltage. Thereafter, the cyclic A/D converter 2 performs the A/D conversion by further using the A/D conversion circuit 7. The cyclic A/D converter 2 according to the third embodiment operates similarly as in the first embodiment. The operation of the cyclic A/D converter 2 according to the third embodiment is described with reference to FIG. 3 as well. It is noted that the C/V conversion in FIG. 3 is referred to as the I/V conversion and the terminals FE1 and FE2 are not referred to.

The control circuit 8 performs the I/V conversion operation prior to the amplification operation and the A/D conversion operation. That is, the switching circuit 5 is switched to the multiplying D/A converter 6 side and the switches S10 and S11 are switched to the switching circuit 5 side. Further, the switches S1, S2, S13, S14, S16 are turned on and the switches S3, S12, S15 are turned off. Thus, charges of the capacitors are initialized [Sampling] This charge initialization operation corresponds to resetting of the I/V conversion operation. FIG. 7A schematically shows a part of the cyclic A/D converter 2, which relates to the I/V conversion operation in the period of being reset (reset period). As shown in FIGS. 3 and 7A, the inverting input terminal and the output terminal of the operational amplifier 9 are shorted by the switch S14. The capacitor CG thus is not charged with the detection current Iin.

Then, the switch S14 is turned off to charge the capacitor CF with the detection current Iin. This charge setting operation corresponds to conversion in the I/V conversion operation. FIG. 7B schematically shows a part of the cyclic A/D converter 2, which relates to the I/V conversion operation in a period of the conversion operation (conversion period). As shown in FIGS. 3 and 7B the capacitor CG is connected between the inverting input terminal and the output terminal of the operational amplifier 9. The capacitor CG is charged with the detection current Iin. Thus, the output voltage of the operational amplifier 9 after the I/V conversion is expressed by the following equation (7), in which the conversion period (conversion time) is assumed to be t.

$$Vo = Vcom - (Iin/CG) \cdot t \qquad (7)$$

The output voltage Vo thus corresponds to a sum of the offset voltage Vcom and a voltage, which is amplified by a gain $-t/CG$. At this time the capacitors CF, CS10 and CS11 are charged by the output voltage Vo (sampling). The amplification operation and the A/D conversion operation are performed in the similar manner as in the first embodiment after the I/V conversion operation. It is also possible that the A/D conversion operation is performed in the similar manner as in the second embodiment after the I/V conversion operation.

As described above, the cyclic A/D converter 2 I/V-converts the detection current Iin by using the switching elements, which are originally and normally provided for A/D conversion, before performing the A/D conversion, if the detection current Iin is inputted as the input signal. The cyclic A/D converter 2 according to the third embodiment thus A/D converts a signal outputted from a current output type sensor.

Fourth Embodiment

A cyclic A/D converter according to a fourth embodiment is described next with reference to FIGS. 8 to 10, in which the same or similar parts as in the first embodiment are designated with the same or similar reference numerals.

Figure 8:
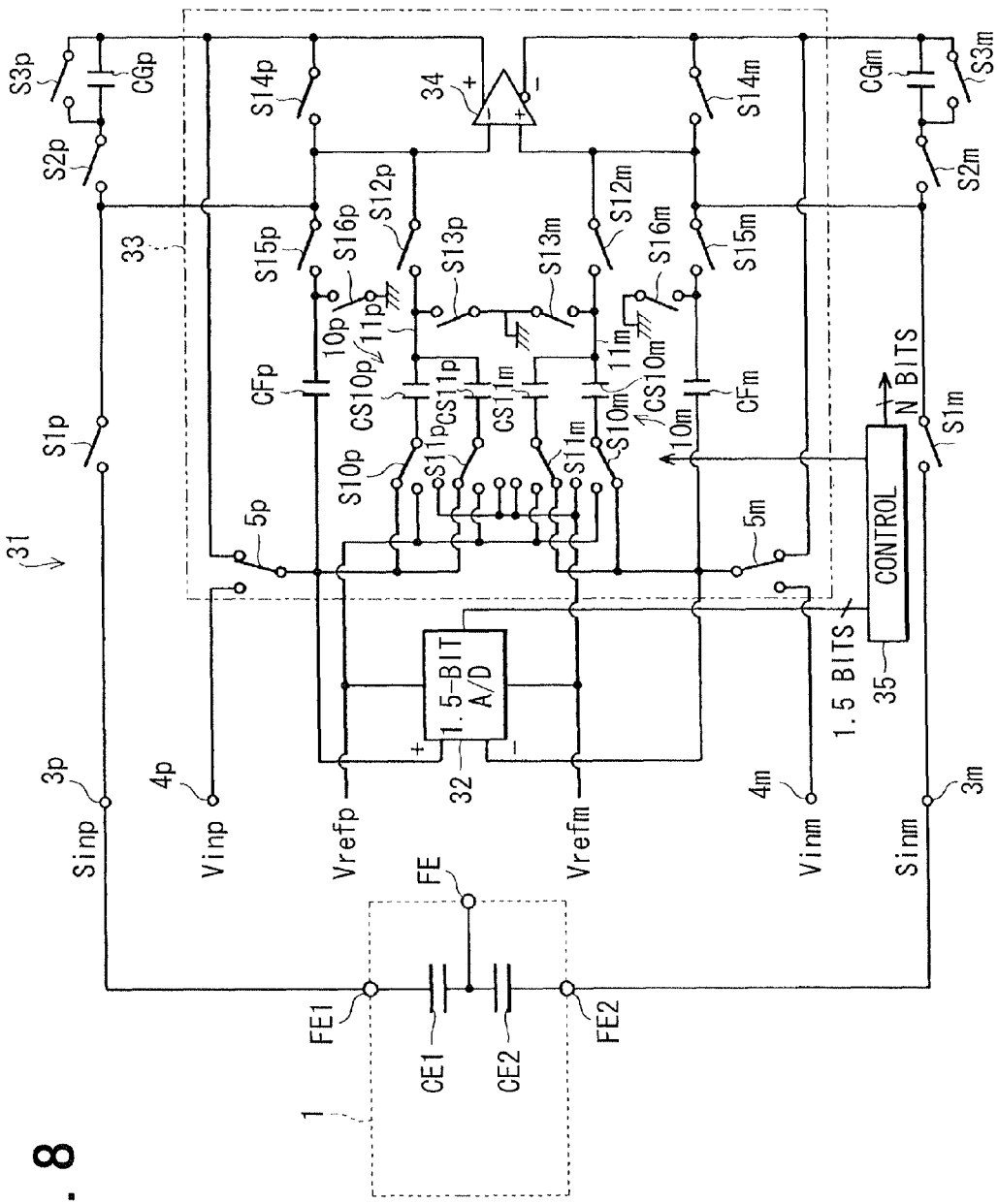
FIG. 8 is a circuit diagram of a cyclic A/D converter according to a fourth embodiment of the present invention.
Figure 9:
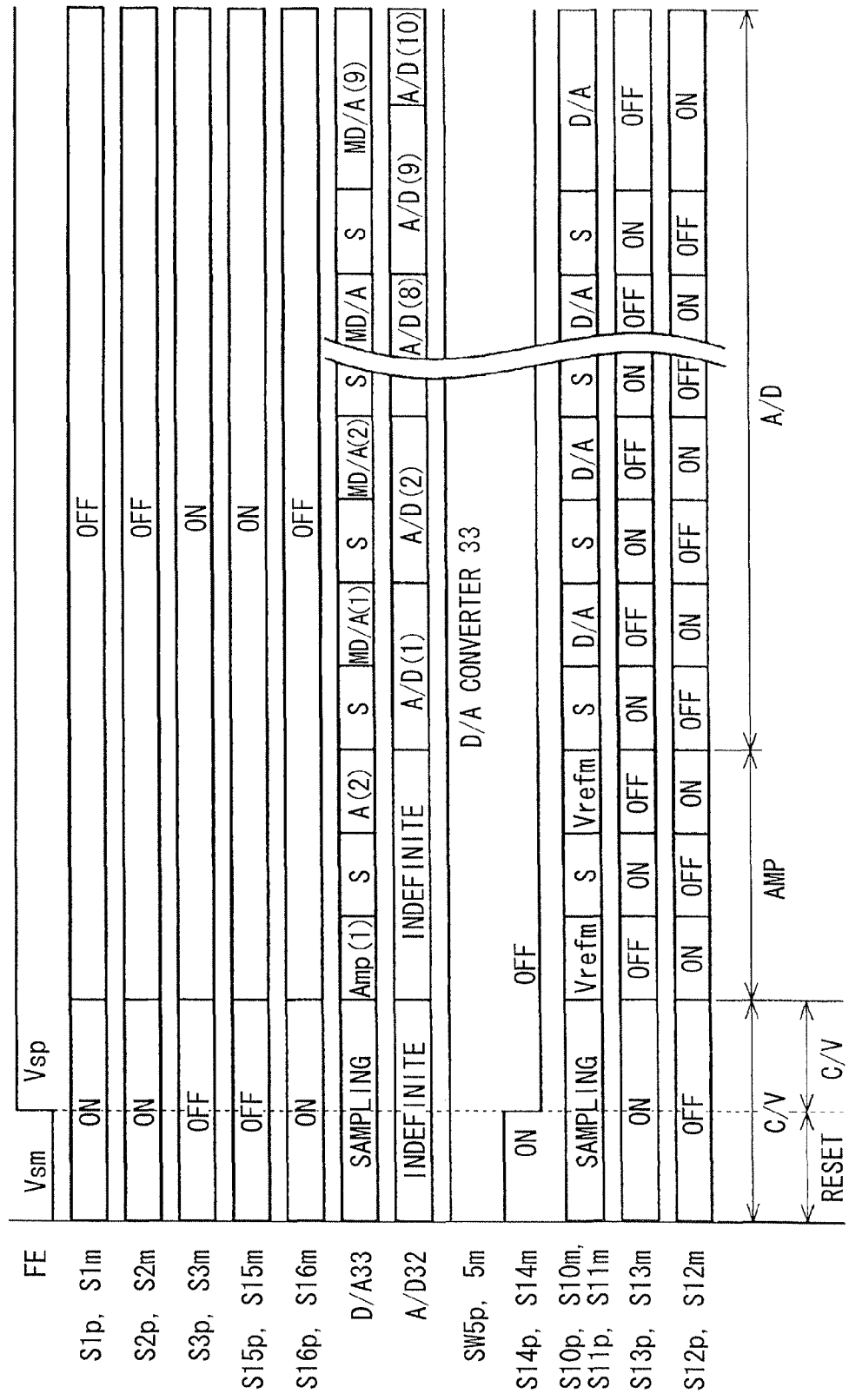
FIG. 9 is an operation diagram of the cyclic converter according to the fourth embodiment.

As shown in FIG. 8, the capacitors CE1 and CE2 of the sensor element 1 are connected to terminals FE1 and FE2, respectively. These terminals FE1 and FE2 are connected to signal input terminals 3p and 3m of a cyclic A/D converter 31, respectively. The capacitors CE1 and CE2 are connected to each other and to a common terminal FE. Drive voltages Vsp and Vsm are applied to the terminal FE alternately.

The cyclic A/D converter 31 is configured by modifying the cyclic A/D converter 2 to operate differentially. The cyclic A/D converter 31 is configured with an A/D conversion circuit 32, a multiplying D/A converter (residual voltage generation circuit) 33, capacitors (first integrating capacitors) CGp, CGm and switches S1p to S3p, S1m to S3m. An operational amplifier 34, which is differential output type, is configured to have a non-inverting output terminal and an inverting output terminal to output differential voltages, respectively, which change in opposite phase with respect to an intermediate voltage (Vrefp+Vrefm)/2.

A non-inverting input terminal of the A/D conversion circuit 32 is selectively connectable to a non-inverting signal input terminal 4p or the non-inverting output terminal of the operational amplifier 34 by way of a switch 5p, which corresponds to an input circuit. Similarly, an inverting input terminal of the A/D conversion circuit 32 is selectively connectable to an inverting signal input terminal 4m or the inverting output terminal of the operational amplifier 34 by way of a switch 5m, which corresponds to an input circuit. The switches 5p and 5m are fixedly switched to the output terminals of the operational amplifier 34, respectively, when the input signal is a charge other than a voltage. This state is shown in FIG. 8.

In the similar manner shown in FIG. 1, between a common junction of the switch 5p and the inverting input terminal of the operational amplifier 34, a capacitor (second integrating capacitor) CFp, a switch S15p, a capacitor array circuit 10p, switches S10p, S11p, and a switch (switching circuit) S12p are connected. The capacitor array circuit 10p is formed of array capacitors CS10p and CS11p. Each of the switches S10p and S11p are switchable to select different input signals applied to the respective array capacitors CS10p and CS11p. A switch S13p is connected between a common line 11p and the ground. A switch S14p is connected between the inverting input terminal and the non-inverting output terminal of the operational amplifier 34. A junction between the capacitor CFp and a switch S15p is connected to the ground through a switch S16p. A switch (input switching circuit) S1p is connected between the signal input terminal 3p and the inverting input terminal of the operational amplifier 34. A switch S2p and a capacitor CGp are connected in series between the inverting input terminal and the non-inverting output terminal of the operational amplifier 34. A switch S3p is connected between both terminals of the capacitor CGp.

Similarly, between a common junction of the switch 5m and the non-inverting input terminal of the operational amplifier 34, a capacitor (second integrating capacitor) CFm, a switch S15m, a capacitor array circuit 10m, switches S10m, S11m, and a switch (switching circuit) S12m are connected. The capacitor array circuit 10m is formed of array capacitors CS10m and CS11m. Each of the switches S10m and S11m are switchable to select different input signals applied to respective array capacitors CS10m and CS11m. A switch S13m is connected between a common line 11m and the ground. A switch S14m is connected between the non-inverting input terminal and the inverting output terminal of the operational amplifier 34. A junction between the capacitor CFm and a switch S15m is connected to the ground through a switch S16m A switch (input switching circuit) S1m is connected between the signal input terminal 3m and the non-inverting input terminal of the operational amplifier 34. A switch S2m and a capacitor CGm are connected in series between the non-inverting input terminal and the inverting output terminal of the operational amplifier 34. A switch S3m is connected between both terminals of the capacitor CGm. It is preferred that the circuit arrangement is configured symmetrically between the non-inverting signal side and the inverting signal side.

An A/D conversion code "n" outputted from the A/D conversion circuit 32 is added while being shifted bit by bit in a shift addition circuit (not shown) provided in a control circuit 35. The operation of cyclic the A/D converter 31 is shown in FIG. 9. As understood from FIG. 9, the operation timings of the cyclic A/D converter 31 are similar to that of the cyclic A/D converter 2 shown in FIG. 3. It is noted however that, the switches S10p and S11p are switched in accordance with the A/D conversion code "n" outputted from the A/D conversion circuit 32 at the time of reallocation of charges in the A/D conversion operation. At this time, the switches S10m and S11m are switched in accordance with a value 2-n. In this sequence of operation, the switches provided at the non-inverting signal side and the inverting signal side are driven to perform respective switching operations at the same time between both signal sides.

The C/V conversion operation by the cyclic A/D converter 31 is performed as follows. FIG. 10A schematically shows a part of the cyclic A/D converter 31, which relates to the C/V conversion operation in a reset period. As shown in FIGS. 9 and 10A, a voltage Vsm is applied to the terminal FE of the sensor element 1 during the reset period. The inverting input terminal and the non-inverting output terminal of the operational amplifier 34 are shorted by the switch S14p. Similarly, the non-inverting input terminal and the inverting output terminal of the operational amplifier 34 are shorted by the switch S14m. Thus a charge Qrp at the inverting input terminal of the operational amplifier 34 in the reset period is expressed by the following equation (8), in which the voltage at the inverting input terminal is assumed to be Vcom. Similarly, a charge Qrm at the non-inverting input terminal is expressed by the following equation (9), in which the voltage at the non-inverting input terminal is assumed to be Vcom.

$$Qrp=(CE+\Delta C/2)(Vsm-Vcom) \tag{8}$$

$$Qrm=(CE-\Delta C/2)(Vsm-Vcom) \tag{9}$$

FIG. 10B schematically shows a part of the cyclic A/D converter 31, which relates to the C/V conversion operation in a conversion period. As shown in FIGS. 9 and 10B, the voltage Vsp is applied to the terminal FE of the sensor element 1 during the conversion period. The capacitor CGp is connected between the inverting input terminal and the non-inverting output terminal of the operational amplifier 34. Similarly, the capacitor CGm is connected between the non-inverting input terminal and the inverting output terminal of the operational amplifier 34. Thus, a charge Qcp at the inverting input terminal of the operational amplifier 34 in the conversion period is expressed by the following equation (10), in which the input voltage at the inverting input terminal and the output voltage at the non-inverting output terminal of the operational amplifier 34 are assumed to be Vx and Vop, respectively. Similarly, a charge Qcm at the non-inverting input terminal is expressed by the following equation (11), in which the input voltage at the non-inverting input terminal and the output voltage at the inverting output terminal are assumed to be Vx and Vom, respectively.

$$Qcp=(CE+\Delta C/2)(Vsp-Vx)+CGp(Vop-Vx) \tag{10}$$

$$Qcm=(CE-\Delta C/2)(Vsp-Vx)+CGm(Vom-Vx) \tag{11}$$

The charges Qrp and Qcp as well as the charges Qrm and Qcm in the foregoing periods are equal as expressed by the following equations (12) and (13) according to the law of conservation of charge.

$$Qrp=Qcp \tag{12}$$

$$Qrm=Qcm \tag{13}$$

From the equations (8) to (13), the difference between the output voltages Vop and Vom, that is, the differential output voltage of the operational amplifier 34, is expressed by the following equation (14). Here, it is assumed that both capacitances of the capacitors CGP and CGm are equal to CG.

$$Vop-Vom=-(\Delta C/(CE+CG))(Vsp-Vsm) \tag{14}$$

The differential output voltage Vop-Vom of the operational amplifier 34 after C/V conversion thus corresponds to a voltage, which is an amplification of a change $\Delta C$ in capacitances of the capacitors CE1 and CE2 by a gain $-(1/(CE+CG))(Vsp-Vsm)$.

As described above, the A/D converter 31 performs the similar operation which is performed by the cyclic A/D converter 2, when the signal charge Sin is inputted from the sensor element 1 of a capacitive type acceleration sensor. Further, the A/D converter 31 also performs the similar operation, which is performed by the cyclic A/D converter 2, when the signal voltage Vin is inputted from a voltage output type sensor. The A/D converter 31 according to the fourth embodiment thus provides the similar operation and advantage. Further, since a differential charge, between signal charges Sinp and Sinm or a differential voltage between signal voltages Vinp and Vinm is A/D-converted, common mode noise applied from an external side are effectively removed.

Fifth Embodiment

Figure 11:
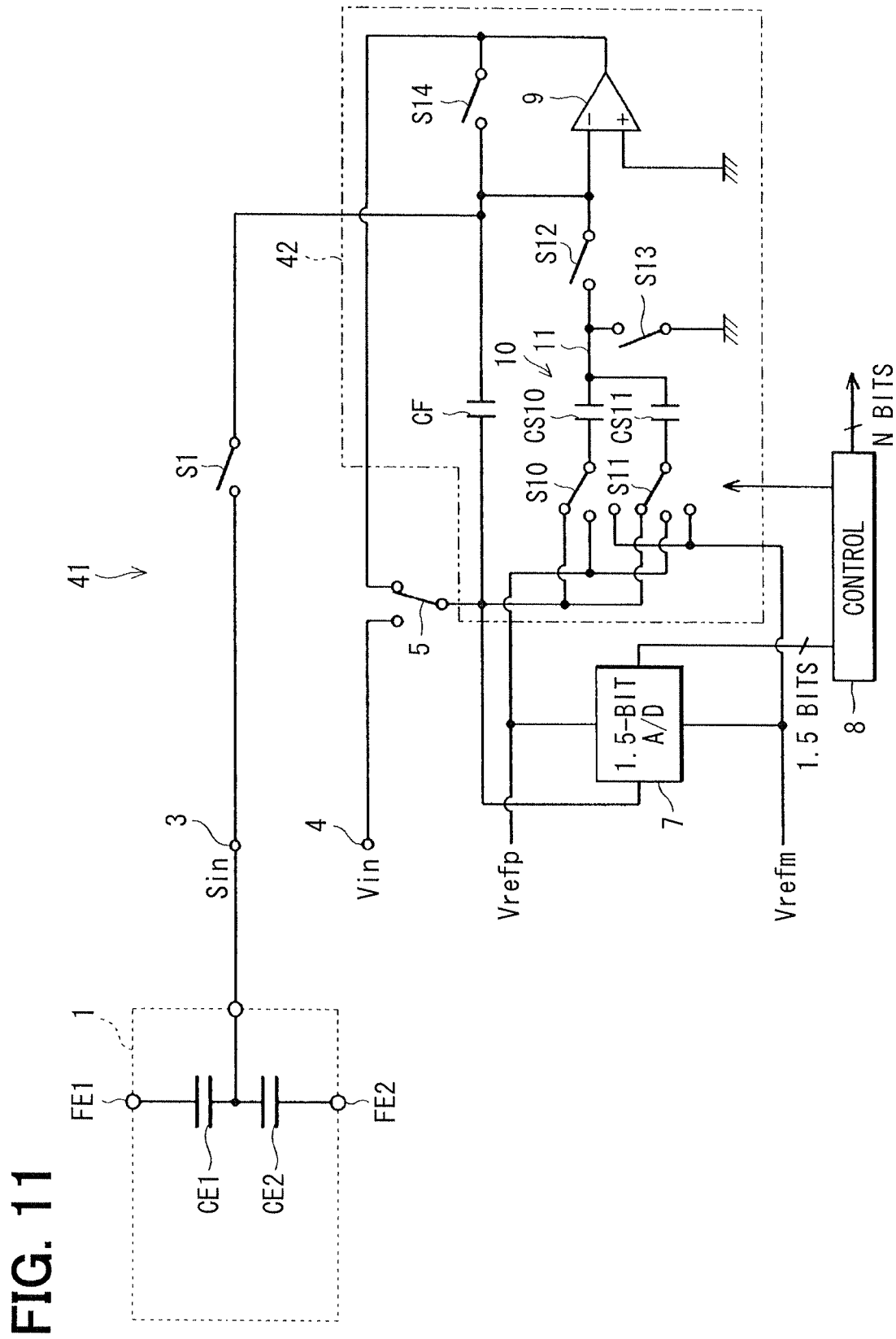
FIG. 11 is a circuit diagram of a cyclic A/D converter according to a fifth embodiment of the present invention.

A cyclic A/D converter according to a fifth embodiment is described next with reference to FIGS. 11 and 12, in which the same or similar parts as the first embodiment are designated by the same or similar reference numerals.

A cyclic A/D converter 41 is different from the cyclic A/D converter 2 shown in FIG. 1 in that the capacitors CG and switches S2, S3 are not provided and a multiplying D/A converter 42 is provided in place of the multiplying D/A converter 6 as a residual voltage generation circuit. The multiplying D/A converter 42 is different from the multiplying D/A converter 6 shown in FIG. 1 in that the switches S15 and S16 are not provided. Since the switch S15 is not provided, one terminal of the capacitor CF is connected to the inverting input terminal of the operational amplifier 9.

Figure 12:
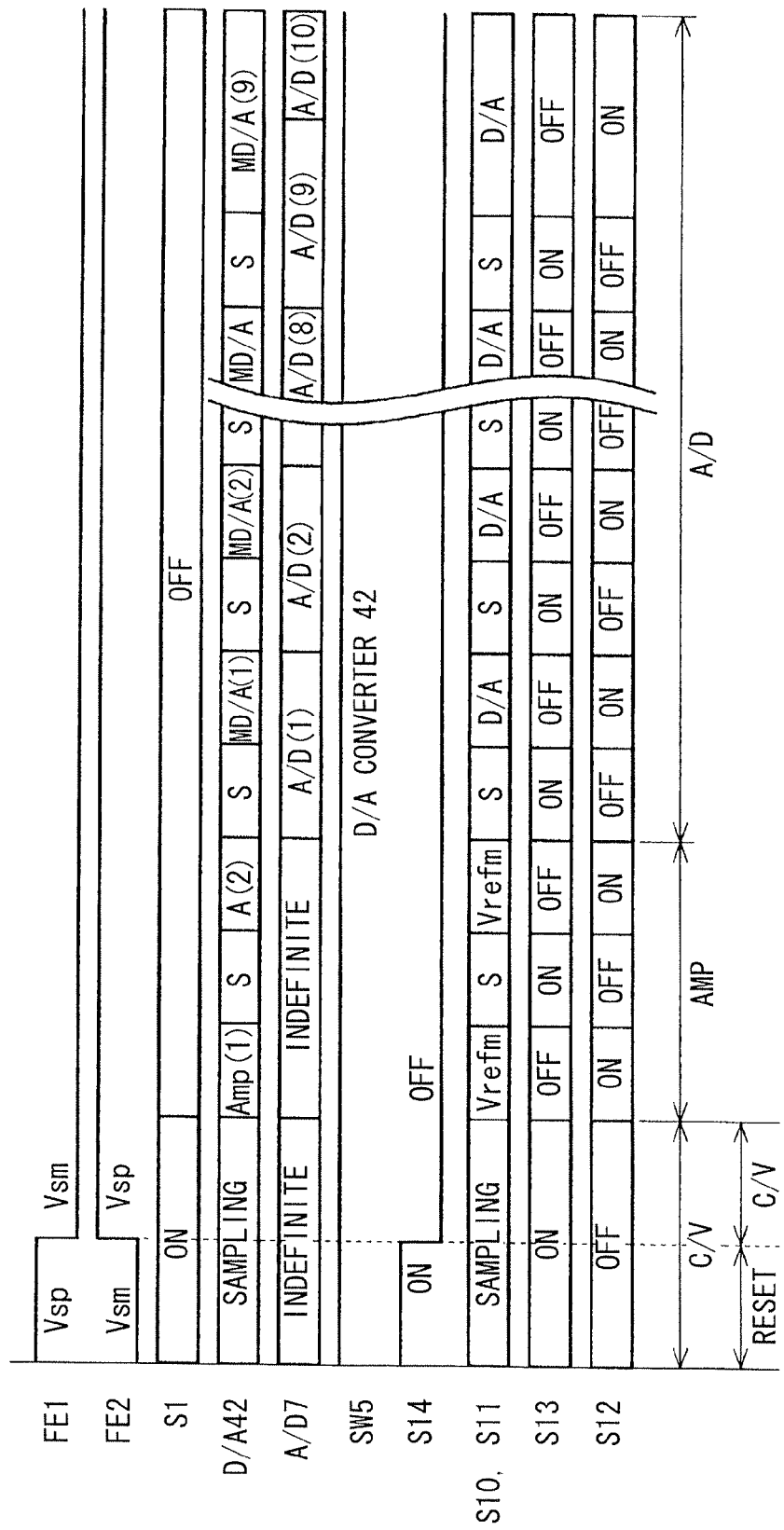
FIG. 12 is an operation diagram of the cyclic A/D converter according to the fifth embodiment.

The operation timings of the cyclic A/D converter 41 are shown in FIG. 12. Similarly to the cyclic A/D converter 2 according to the first embodiment, the cyclic A/D converter 41 first QV-converts the signal charge Sin by using the switching circuit 5, the multiplying D/A converter 42 and the like, which are originally and normally provided in the cyclic A/D converter 41, and amplifies the converted voltage. The cyclic A/D converter 41 then performs the A/D conversion by further using the A/D conversion circuit 7. In the cyclic A/D converter 2 according to the first embodiment, the capacitor CG is used as the integrating capacitor during the C/V conversion operation. In the cyclic A/D converter 41 according to the fifth embodiment, however, the capacitor CF is used even in the C/V conversion operation. Thus, the capacitor CF is used as the first integrating capacitor and the second integrating capacitor.

According to the fifth embodiment as well, when the signal charge Sin is inputted as the input signal the cyclic A/D converter 41 first performs the C/V conversion of the signal charge Sin by using the switching circuit 5, the multiplying D/A converter 42 and the like, which are originally normally provided for A/D conversion, prior to the amplification operation and the A/D conversion operation. Further, by using the capacitor CF as the first integrating capacitor and the second integrating capacitor, the capacitor CG and the switches S2, S3, S15 and S16 of the first embodiment need not be provided. The cyclic A/D converter 41 according to the fifth embodiment is thus reduced in circuit size and IC chip size further in comparison to that according to the first embodiment.

Other Embodiments

The first to the fourth embodiments may be modified to different embodiments as follows.

Although the conversion voltage is amplified by being passed to the multiplying converter 6, 33 two times (that is, circulated once), it may be A/D-converted after being passed once or after being passed three or more times (that is, circulated twice or more). By setting the number of times of passing (circulation) appropriately, the cyclic A/D converter is configured to have a function of a programmable variable gain amplifier. During the amplification operation, the gain may be varied each time the signal to be amplified is passed through. In this instance, the gain in the amplification operation of the conversion voltage and the gain in the subsequent A/D conversion operation are set independently of each other. The gain in the amplification operation may be equal to or less than 1. In case of the first embodiment, for example, all the capacitors CF, CS10 and CS11 are set with respective charges in the amplification operation. However, only one or two of the capacitors CF, CS10 and CS11 may be set with charges. At the time of reallocation of charges for the amplification operation, one or all of the switches S10 and S11 may be switched to the switching circuit 5 side. Thus, it is possible to realize a variety of different gains.

The capacitor CF may be configured to have a variable capacitance, so that the capacitance of the capacitor CF for the amplification operation and the subsequent A/D conversion operation may be set independently of each other. In the first to the fifth embodiments an offset voltage for the amplification operation may be provided. That is, each time the converted voltage or the amplified voltage is passed to the multiplying D/A converter 6 or 33, a predetermined value of the analog voltage may be set to a different value. In case of the first embodiment, for example, at least one of the switches S10 and S11 may be switched to the Vrefp side at the time of charge reallocation for the amplification operation. It is possible to variably determine performance of the amplification operation, to variably determine the number of circulations in performing the amplification operation, and to perform the A/D conversion by the A/D conversion circuit 7, 32 in both the C/V conversion operation and the amplification operation. Based on the conversion result, the circulation operation may be terminated by checking whether the converted voltage or the amplified voltage is amplified to a dynamic range suitable for the A/D conversion. In this instance, the A/D conversion value may be corrected by storing the number of circulations (number of passing to the multiplying D/A converter 6, 33) and the gain in each circulation in the control circuit 8, 35.

What is claimed is:

1. A cyclic A/D converter comprising:
an A/D conversion circuit;
a residual voltage generation circuit configured to generate a residual voltage by amplifying a differential voltage between an input voltage, which is applied to the A/D conversion circuit, and a predetermined analog voltage;
an input circuit configured to select a residual voltage outputted from the residual voltage generation circuit or an input voltage inputted from an external side and apply a selected voltage to both the A/D conversion circuit and the residual voltage generation circuit;
a control circuit configured to control the input circuit and the residual voltage generation circuit so that the A/D conversion circuit performs an A/D conversion of the residual voltage outputted by the residual voltage generation circuit while using, as the predetermined analog voltage of the residual voltage generation circuit, a D/A conversion value of a digital conversion value outputted from the A/D conversion circuit to circulate the residual voltage through the input circuit, the A/D conversion circuit and the residual voltage generation circuit; and an input switching circuit configured to switchably input an external signal charge to the residual voltage generation circuit, wherein the control circuit is configured to control the input switching circuit to input the external signal charge to the residual voltage generation circuit, control the residual voltage generation circuit to perform a voltage conversion operation for outputting a converted voltage corresponding to the external signal charge and control the input circuit to select the converted voltage for application to the A/D conversion circuit and the residual voltage generation circuit, before the A/D conversion circuit starts the A/D conversion operation of the converted voltage outputted from the residual voltage generation circuit.

2. The cyclic A/D converter according to claim 1, wherein:
the residual voltage generation circuit includes a capacitor array circuit, an operational amplifier, a switching circuit, a first integrating capacitor, and a second integrating capacitor,
the capacitor array circuit including at least one array capacitor having one end as a common side electrode connectable to a common line and the other end as a non-common side electrode connectable to a plurality of reference voltage lines,
the operational amplifier inputting a voltage of the common line,
the switching circuit provided in a signal path between the common line and the operational amplifier, and the first integrating capacitor and the second integrating capacitor connectable between an input terminal and an output terminal of the operational amplifier; and
the control circuit is configured to
connect the first integrating capacitor between the input terminal and the output terminal of the operational amplifier after initializing the first integrating capacitor,
input the external signal charge toward the input terminal while turning off the switching circuit so that the first integrating capacitor is charged with a charge corresponding to the external signal charge,
perform the voltage conversion operation thereby to output the converted voltage corresponding to a terminal voltage of the first integrating capacitor from the operational amplifier,
then charge selected one of the second integrating capacitor and the array capacitor with a charge corresponding to the converted voltage and initialize the other of the second integrating capacitor and the array capacitor,
connect the second integrating capacitor between the input terminal and the output terminal of the operational amplifier,
connect the non-common side electrodes of the array capacitors to the plurality of reference voltage lines in accordance with a conversion result of the A/D conversion circuit while turning on the switching circuit so that charges are reallocated between the array capacitor and the second integrating capacitor, and
then repeat a plurality of times, a sequence of charging the capacitor with the residual voltage outputted from the operational amplifier, initializing the capacitor and reallocation of charge of the capacitor thereby to perform an A/D conversion operation for A/D-converting the converted voltage.

3. The cyclic A/D converter according to claim 2, wherein:
the control circuit is configured to
charge selected one of the second integrating capacitor and the array capacitor with charge corresponding to the converted voltage through the input circuit after performing the voltage conversion operation, and initialize the other of the second integrating capacitor and the array capacitor,
connect the second integrating capacitor between the input terminal and the output terminal of the operational amplifier,
connect the non-common side electrodes of the array capacitors to the plurality of reference voltage lines while turning on the switching circuit so that charges are reallocated between the array capacitor and the second integrating capacitor,
then perform the amplification operation so that the converted voltage is amplified by repeating the charging of the capacitor with the voltage outputted from the operational amplifier, initialization and subsequent reallocation of charges,
then charge the selected one of the second integrating capacitor and the array capacitor with charge corresponding to the amplified voltage through the input circuit, and initialize the other of the second integrating capacitor and the array capacitor,
connect the second integrating capacitor between the input terminal and the output terminal of the operational amplifier,
connect the non-common side electrodes of the array capacitors to the plurality of reference voltage lines while turning on the switching circuit so that charges are reallocated between the array capacitor and the second integrating capacitor, and
then repeat, a plurality of times, a sequence of charging the capacitor with the residual voltage outputted from the operational amplifier, initializing the capacitor and reallocation of charge of the capacitor thereby to perform the A/D conversion operation for A/D-converting the amplified voltage.

4. The cyclic A/D converter according to claim 2, wherein:
the first capacitor and the second capacitor are formed of a single capacitor.

5. The cyclic A/D converter according to claim 1, wherein:
the A/D conversion circuit, the residual voltage generation circuit, the input circuit and the input switching circuit are all configured to be operable differentially.

6. The cyclic A/D converter according to claim 1, further comprising:
a signal input terminal provided to receive the external signal charge from an external device that varies a capacitance thereof, and to apply the external signal charge to the input switching circuit.

* * * * *